(12) United States Patent
Cai et al.

(10) Patent No.: US 12,376,256 B2
(45) Date of Patent: Jul. 29, 2025

(54) SUPPORT ASSEMBLY AND RACK MODULE

(71) Applicant: Wiwynn Corporation, New Taipei (TW)

(72) Inventors: Lai Wang Cai, New Taipei (TW); Wei Chen Lin, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 0 days.

(21) Appl. No.: 18/636,499

(22) Filed: Apr. 16, 2024

(65) Prior Publication Data
US 2025/0212354 A1 Jun. 26, 2025

(30) Foreign Application Priority Data

Dec. 25, 2023 (TW) .................................. 112150623

(51) Int. Cl.
*H05K 7/14* (2006.01)
(52) U.S. Cl.
CPC .................................. *H05K 7/1489* (2013.01)
(58) Field of Classification Search
CPC ....... H05K 7/1489; H05K 7/183; A47B 88/46
See application file for complete search history.

(56) References Cited

U.S. PATENT DOCUMENTS

| | | | | |
|---|---|---|---|---|
| 6,377,450 B1* | 4/2002 | Gan | ...................... | G11B 33/124 |
| 2009/0095873 A1* | 4/2009 | Peng | ...................... | G11B 33/12 |
| | | | | 248/560 |
| 2011/0075347 A1* | 3/2011 | Liu | ........................ | G06F 1/187 |
| | | | | 361/679.33 |

FOREIGN PATENT DOCUMENTS

CN 213338597 U 6/2021

OTHER PUBLICATIONS

German publication No. (DE 3618252 A1) to Abe Hans Joachim, published date Dec. 3, 1987; see entire document (Year: 1987).*
Document No. (BE 1022080 B1) to Lambaerts, Wim; Published date Feb. 15, 2016. see entire document. (Year: 2016).*
Document No. (CN 113370112 A) to Wu, Yue-Feng et al.; publish date Sep. 10, 2021; see entire document (Year: 2021).*
TW Office Action dated Apr. 30, 2024 in Taiwan application No. 112150623.

* cited by examiner

*Primary Examiner* — Ko H Chan
(74) *Attorney, Agent, or Firm* — McClure, Qualey & Rodack, LLP (57) ABSTRACT

A support assembly is configured to be mounted in a rack. The support assembly includes a support casing and at least one release mechanism. The support casing is formed with at least one hole. The release mechanism includes a slidable component and at least one plunger. The slidable component is slidably disposed on the support casing, the slidable component has at least one slide channel, the plunger is slidably disposed in the slide channel of the slidable component and is inserted into the hole for being engaged with the rack, the plunger has a guiding ramp, and the guiding ramp is configured to resist against an edge of the hole for forcing the plunger to disengage from the rack.

16 Claims, 11 Drawing Sheets

SUPPORT ASSEMBLY AND RACK MODULE

CROSS-REFERENCE TO RELATED APPLICATIONS

This non-provisional application claims priority under 35 U.S.C. § 119 (a) on Patent Application No(s). 112150623 filed in Taiwan, R.O.C. on Dec. 25, 2023, the entire contents of which are hereby incorporated by reference.

TECHNICAL FIELD

The disclosure relates to a support assembly and a rack module.

BACKGROUND

In general, there are a plurality of electronic devices, such as servers, power management devices and so on, installed in a rack. Some of the electronic devices may be slidably disposed in the rack via slide rails or may be fixed in the rack so as not to be movable relative to the rack.

Taking the electronic devices fixed in the rack for instance, these electronic devices are fixed in the rack via screws and nuts generally. During the installation/removal of the electronic device into/from the rack, the screws and nuts should be screwed/released one by one, which is time-consuming and requires a tool additionally. As a result, how to solve the aforementioned issue is a crucial topic in this field.

SUMMARY

The disclosure provides a support assembly and a rack module which enables the support assembly and a device supported thereon to be rapidly removed from the rack and installed into the rack.

One embodiment of the disclosure provides a support assembly configured to be mounted in a rack. The support assembly includes a support casing and at least one release mechanism. The support casing is formed with at least one hole. The release mechanism includes a slidable component and at least one plunger. The slidable component is slidably disposed on the support casing, the slidable component has at least one slide channel. The plunger is slidably disposed in the slide channel of the slidable component and is inserted into the hole for being engaged with the rack. The plunger has a guiding ramp, and the guiding ramp is configured to resist against an edge of the hole when the plunger is disengaging from the rack.

Another embodiment of the disclosure provides a rack module. The rack module includes a rack and a support assembly. The rack is formed with at least one engagement hole. The support assembly includes a support casing and at least one release mechanism. The support casing is formed with at least one hole. The release mechanism includes a slidable component and at least one plunger. The slidable component is slidably disposed on the support casing, the slidable component has at least one slide channel, the plunger is slidably disposed in the slide channel of the slidable component, the plunger is inserted into the hole and is engaged with the engagement hole of the rack, the plunger has a guiding ramp, and the guiding ramp is configured to resist against an edge of the hole when the plunger is disengaging from the engagement hole of the rack.

According to the support assembly and the rack module as discussed in the above embodiments, the slidable component is slidably disposed on the support casing, the plunger is slidably disposed in the slide channel of the slidable component and is inserted into the hole of the support casing for being engaged with the rack, and the plunger has a guiding ramp. Therefore, during the removal of the support assembly from the rack, a maintainer can slide the slidable component so as to force the guiding ramp of the plunger to resist against the edge of the hole when the plunger is disengaging from the rack. As a result, the support assembly and the electronic device supported thereon can be easily and quickly removed from the rack via a toolless manner. Furthermore, the aforementioned configuration also enables the support assembly and the electronic device supported thereon to be easily and quickly installed into the rack via a toolless manner.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 1:
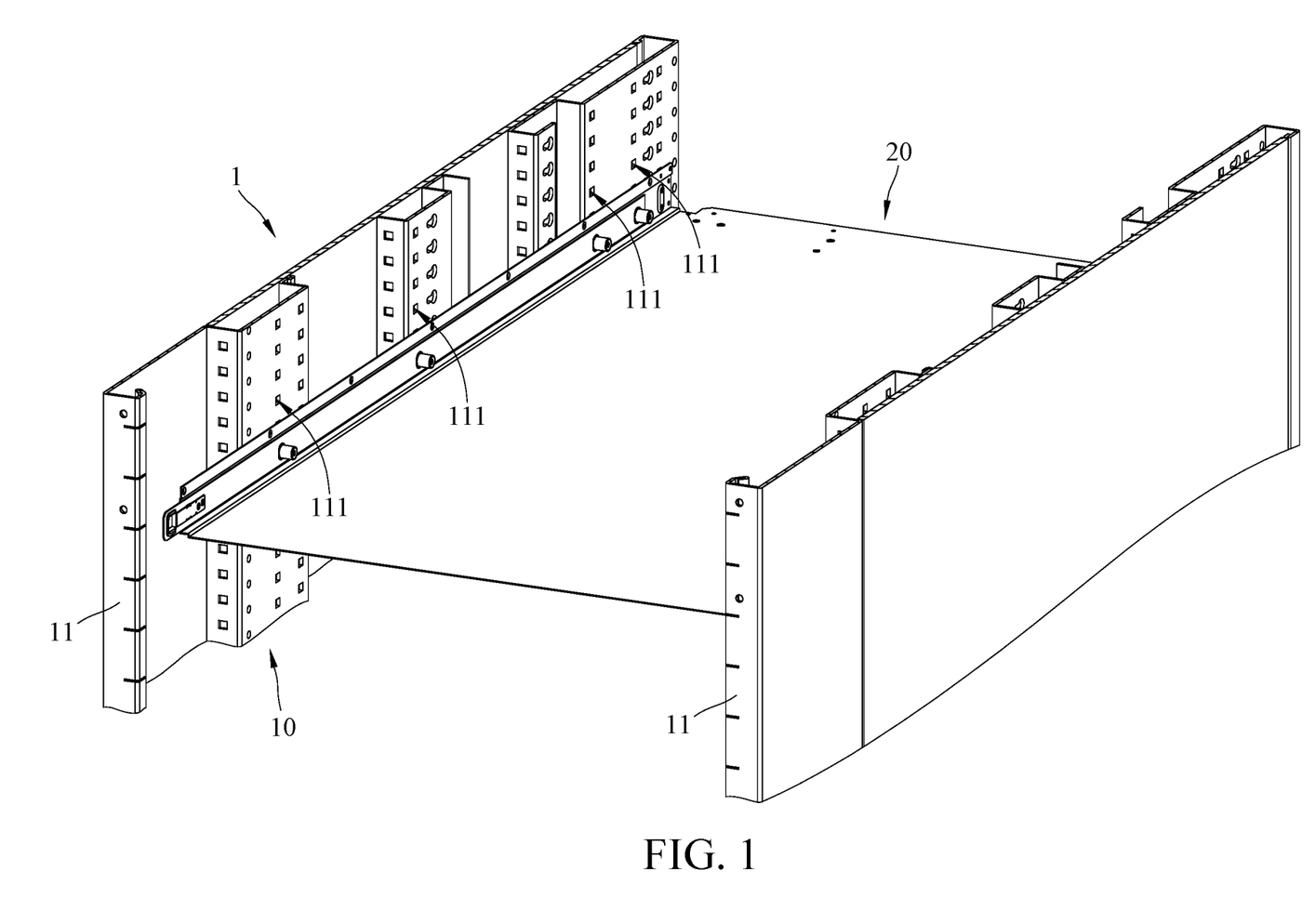
FIG. 1 is a partial perspective view of a rack module according to a first embodiment of the disclosure.
Figure 2:
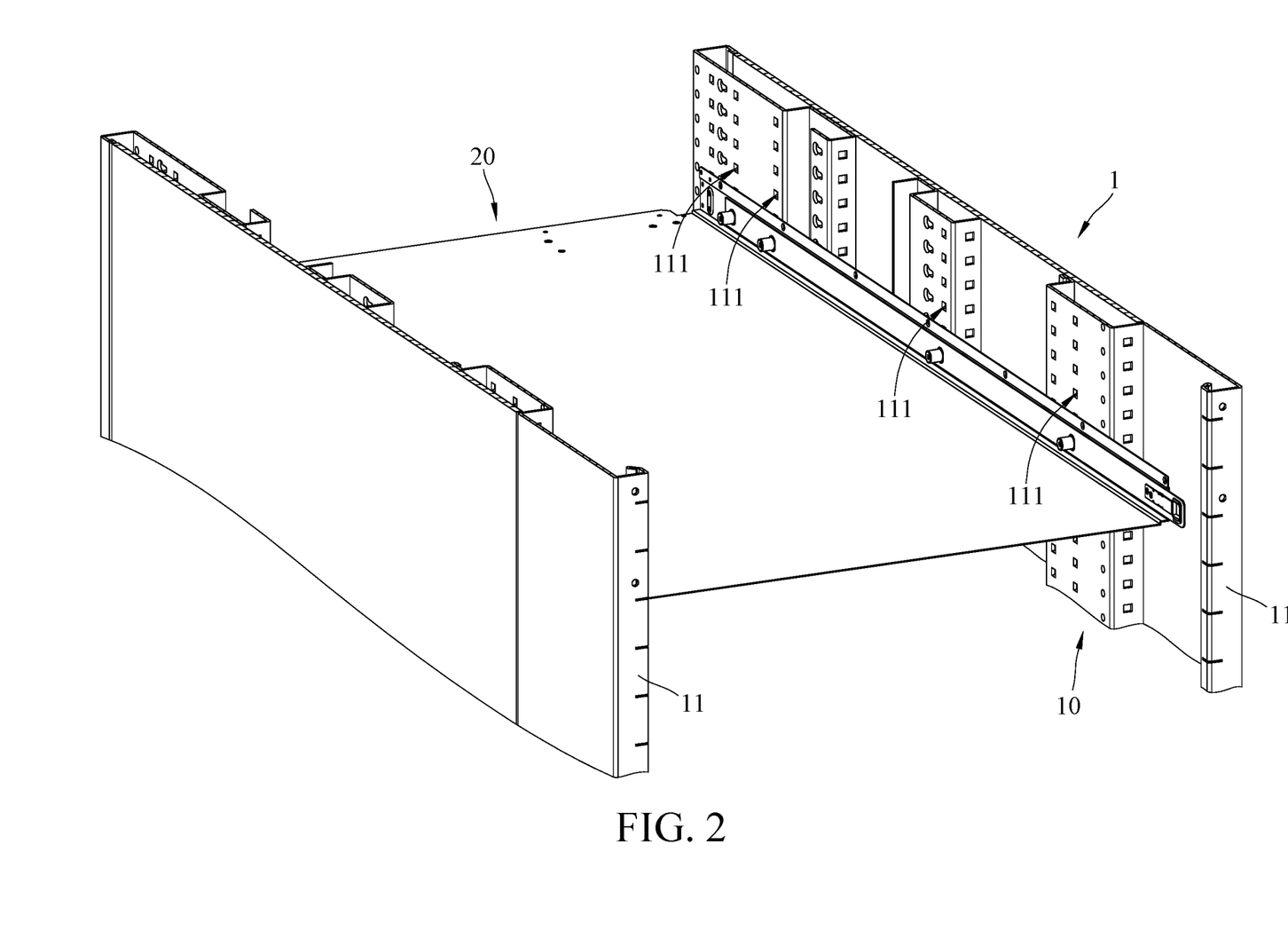
FIG. 2 is another partial perspective view of the rack module in FIG. 1.
Figure 3:
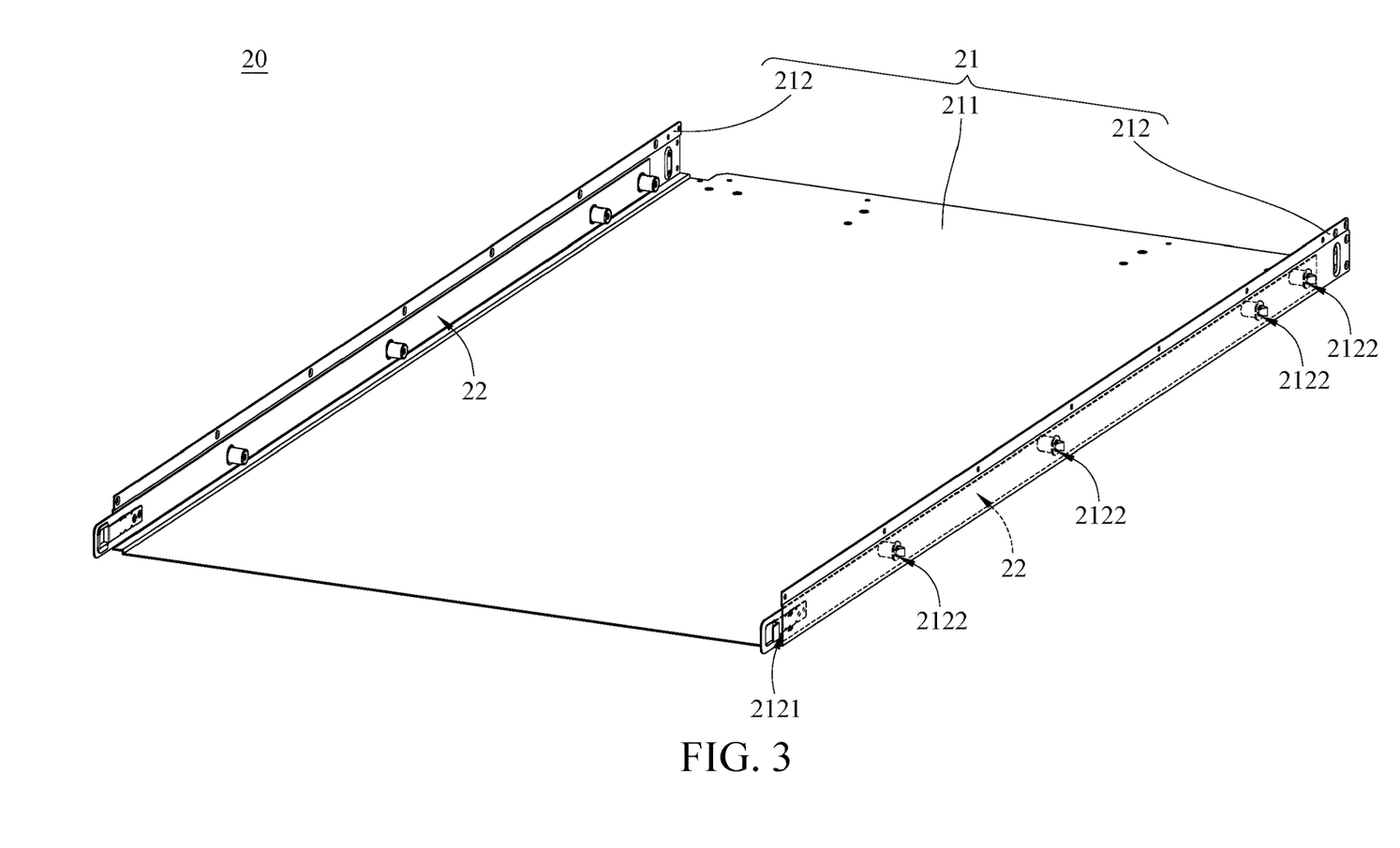
FIG. 3 is a perspective view of a support assembly in FIG. 1.

Referring to FIGS. 1 to 3, FIG. 1 is a partial perspective view of a rack module 1 according to a first embodiment of the disclosure, FIG. 2 is another partial perspective view of the rack module 1 in FIG. 1, and FIG. 3 is a perspective view of a support assembly in FIG. 1.

In this embodiment, the rack module 1 includes a rack 10 and a support assembly 20. The rack 10 includes two side parts 11. Each of the side parts 11 is formed with a plurality of engagement holes 111.

The support assembly 20 includes a support casing 21 and two release mechanisms 22. The support casing 21 is configured to support an electronic device (not shown), such as a server or a power management device. The support casing 21 includes a bottom plate 211 and two side plates 212. The two side plates 212 respectively stand on two opposite sides of the bottom plate 211. The two release mechanisms 22 are respectively disposed on the two side plates 212 of the support casing 21.

Figure 4:
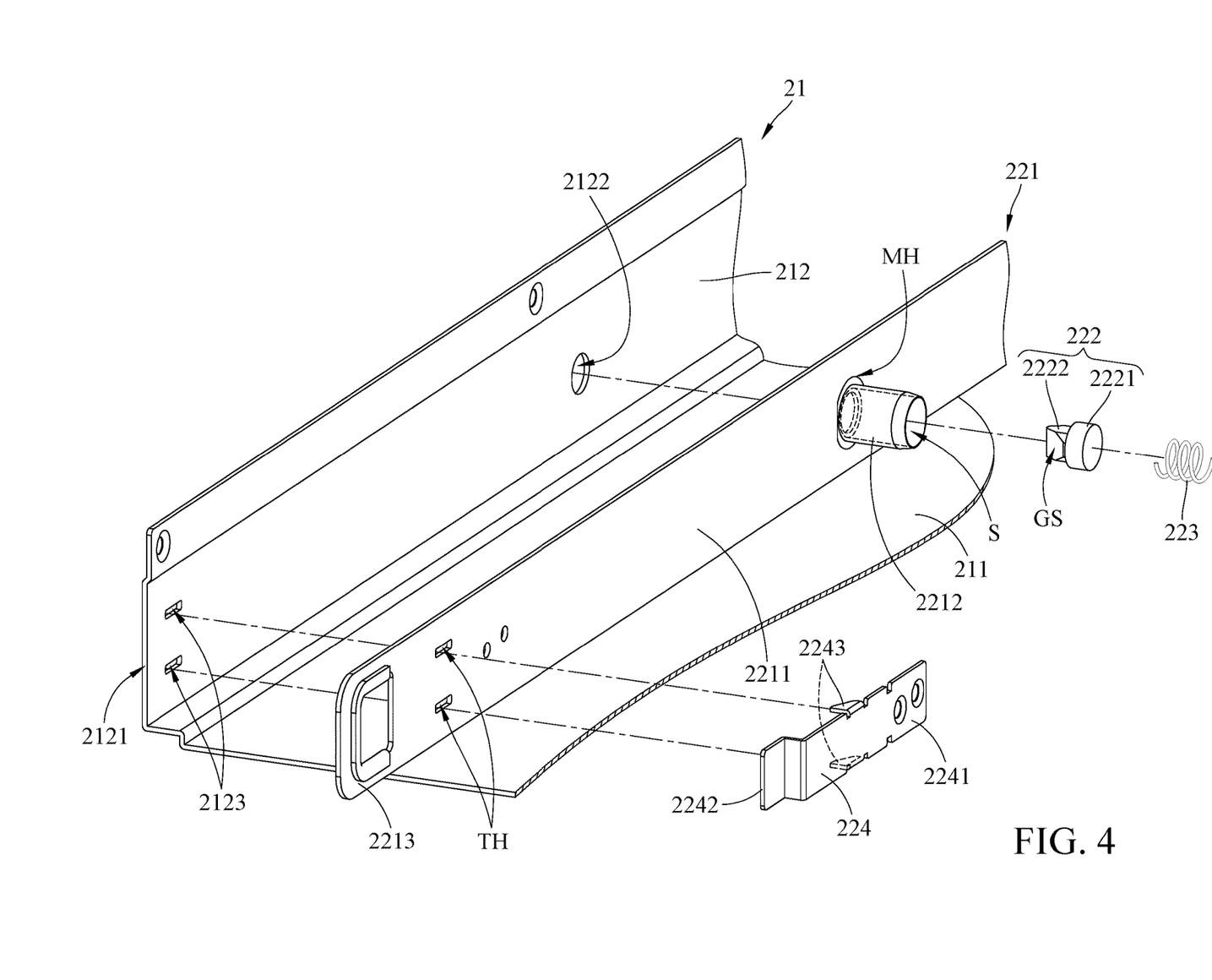
FIG. 4 is a partial exploded view of the support assembly in FIG. 3.
Figure 5:
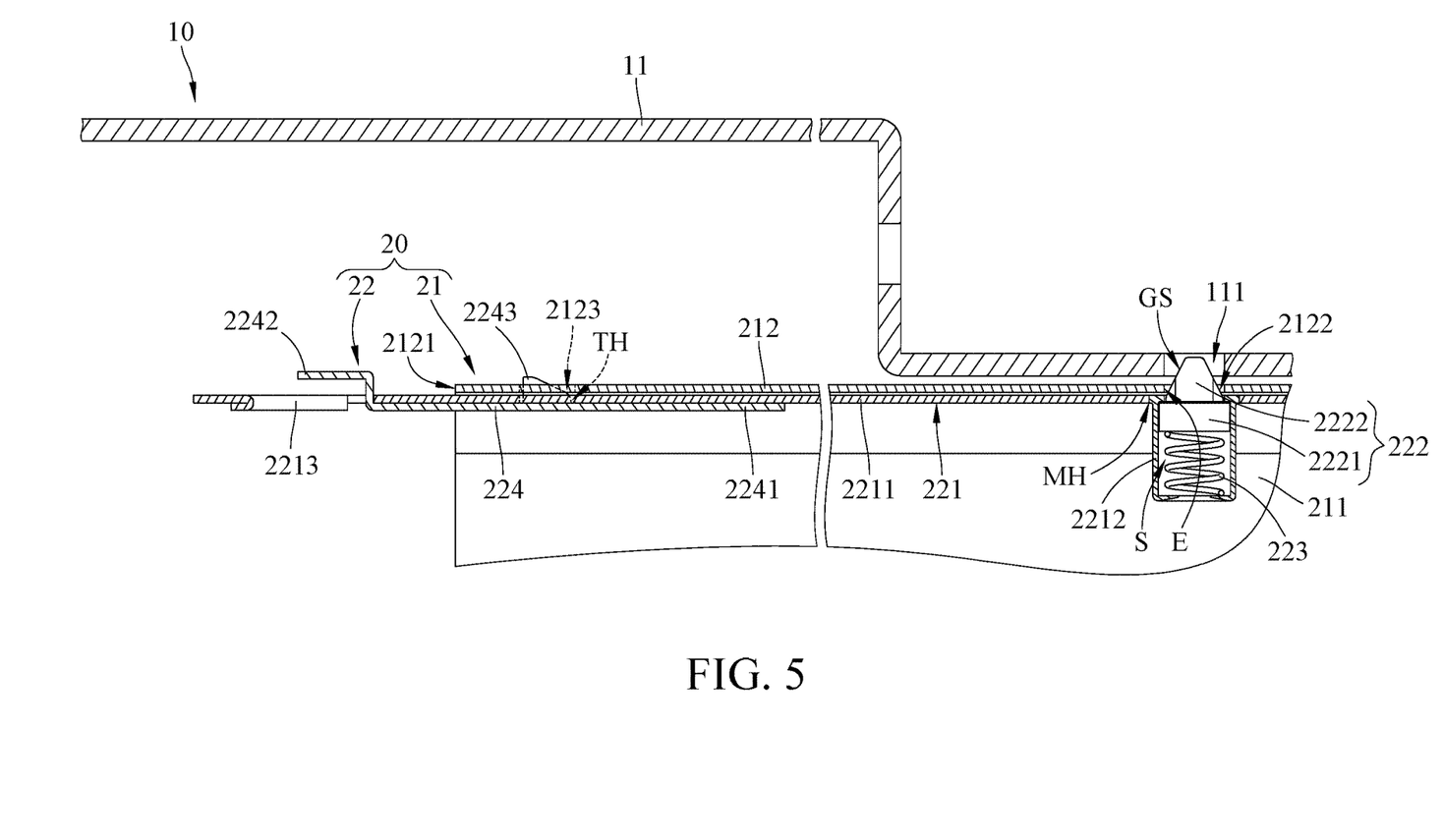
FIG. 5 is a partial cross-sectional view of the rack module in FIG. 1.

In this embodiment, the two release mechanisms 22 are structurally identical, and thus the following paragraphs only specifically introduce one of the release mechanisms 22 and one of the side plates 212 on which such release mechanism 22 is disposed. Referring to FIGS. 3 to 5, FIG. 4 is a partial exploded view of the support assembly 20 in FIG. 3, and FIG. 5 is a partial cross-sectional view of the rack module 1 in FIG. 1.

The side plate 212 has a front side 2121 and is formed with a plurality of holes 2122. The plurality of holes 2122 are spaced apart from one another, and the plurality of holes 2122 are distant from the front side 2121 of the side plate 212 by difference distances. The release mechanism 22 includes a slidable component 221 and a plurality of plungers 222. The slidable component 221 includes a main bar 2211, a plurality of barrels 2212 and a handle 2213. The main bar 2211 is slidably disposed on the side plate 212, and the main bar 2211 is formed with a plurality of mount holes MH. The barrels 2212 are respectively mounted in the mount holes MH of the main bar 2211. Each of the barrels 2212 has a slide channel S. The handle 2213 is connected to the main bar 2211 and extends beyond the front side 2121 of the side plate 212. The plungers 222 are respectively mounted into the slide channels S of the barrels 2212, and the plungers 222 are respectively inserted into the holes 2122 of the side plate 212 and are engaged with the engagement holes 111 of the side part 11 of the rack 10. Taking one of the plungers 222 and the hole 2122 and the engagement hole 111 corresponding thereto for further explanation, the plunger 222 includes a guide portion 2221 and an engagement portion 2222 connected to each other, the guide portion 2221 is slidably disposed in the slide channel S of the barrel 2212 of the slidable component 221, the engagement portion 2222 extends beyond the slide channel S and is inserted into the hole 2122 of the side plate 212 and engaged with the engagement hole 111 of the side part 11 of the rack 10, where the engagement portion 2222 has a guiding ramp GS.

In this embodiment, the plurality of release mechanisms 22 may be pogo pins and further include a plurality of springs 223. The springs 223 are, for example, compression springs. The springs 223 are respectively disposed in the barrels 2212 of the slidable component 221. Taking one of the springs 223 for explanation, two opposite ends of the spring 223 respectively abut the guide portion 2221 of the plunger 222 and the bottom of the barrel 2212 for forcing the plunger 222 to be inserted into the hole 2122 of the side plate 212 and engaged with the engagement hole 111 of the side part 11 of the rack 10.

Moreover, the release mechanism 22 may further include a fastener 224. The fastener 224 is, for example, a stamping sheet. The fastener 224 has a fixed end 2241 and a movable end 2242 located opposite to each other. The fixed end 2241 of the fastener 224 is fixed to the main bar 2211 of the slidable component 221. The movable end 2242 of the fastener 224 extends beyond the front side 2121 of the side plate 212 and is bent to parallel to the handle 2213 of the slidable component 221, and the movable end 2242 of the fastener 224 is movable relative to the slidable component 221.

In this embodiment, the main bar 2211 of the slidable component 221 is formed with two through holes TH, the side plate 212 is formed with two fastening holes 2123, and the fastener 224 further has two engagement block 2243. The engagement blocks 2243 of the fastener 224 are respectively inserted into the through holes TH of the main bar 2211 of the slidable component 221 and are respectively engaged with the fastening holes 2123 of the side plate 212, such that the slidable component 221 is fixed to the side plate 212.

Figure 6:
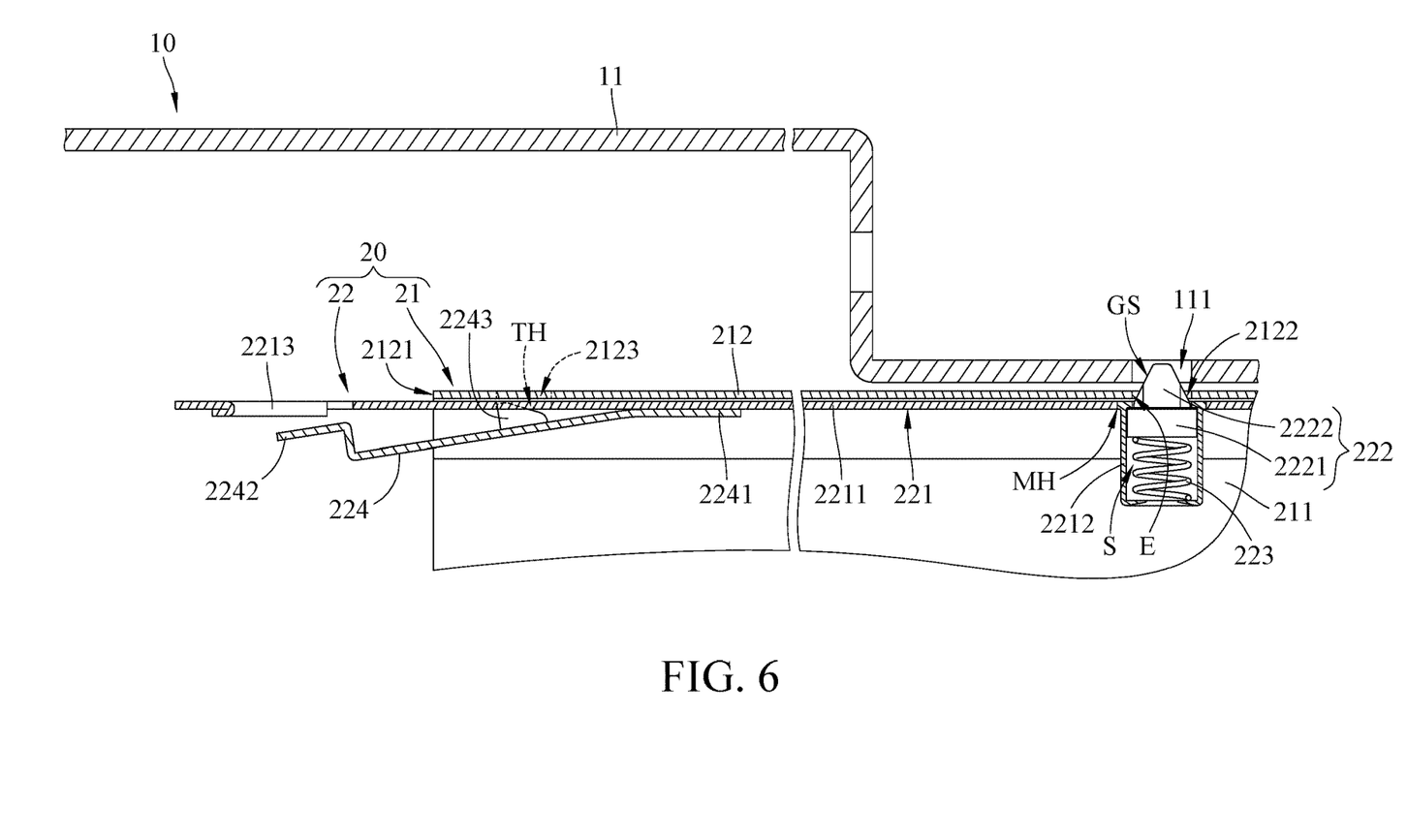
FIG. 6 is a partial cross-sectional view of the rack module in FIG. 4 when a fastener is operated.
Figure 7:
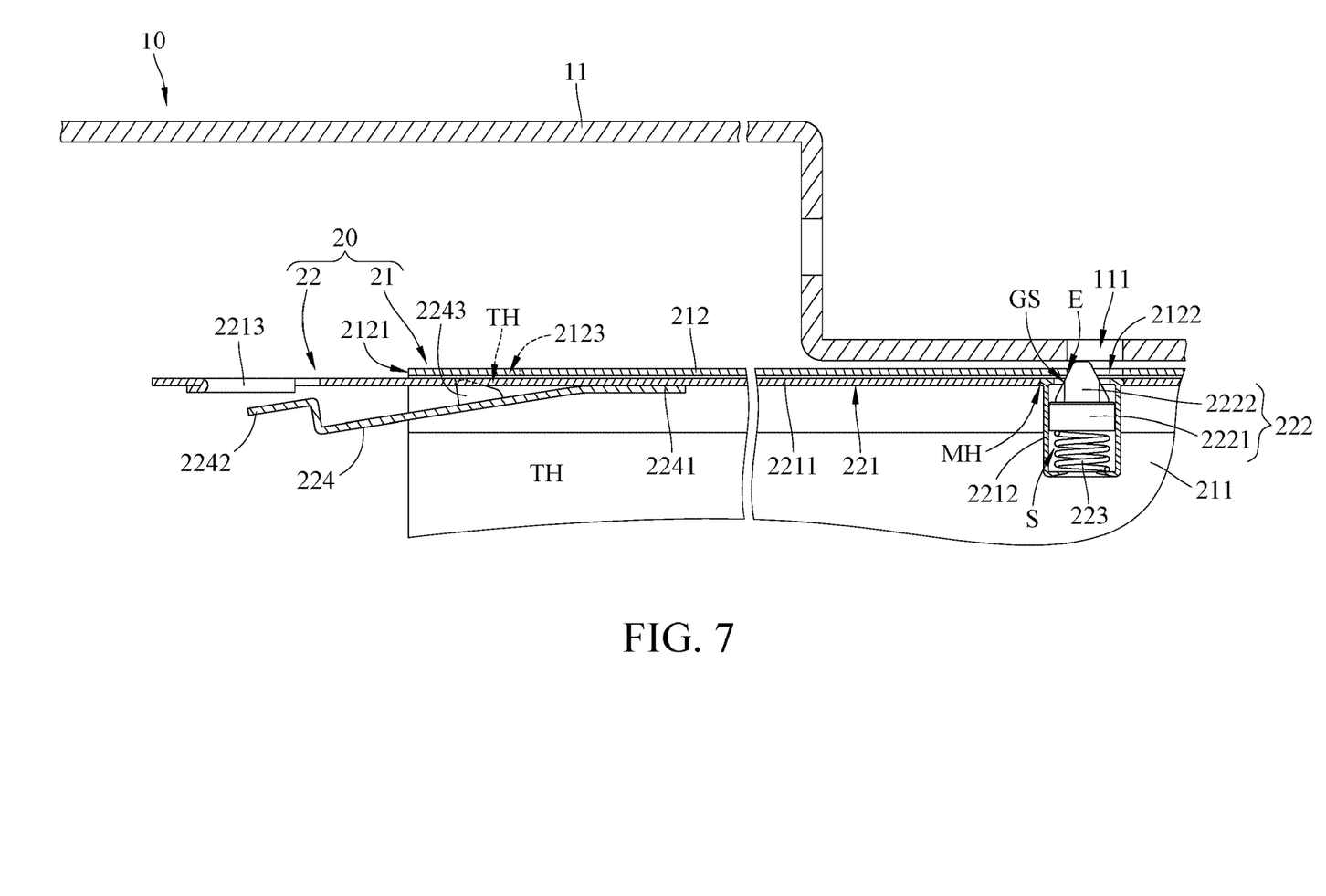
FIGS. 7 and 8 are partial cross-sectional views of the rack module in FIG. 6 when the slidable component is operated.
Figure 8:
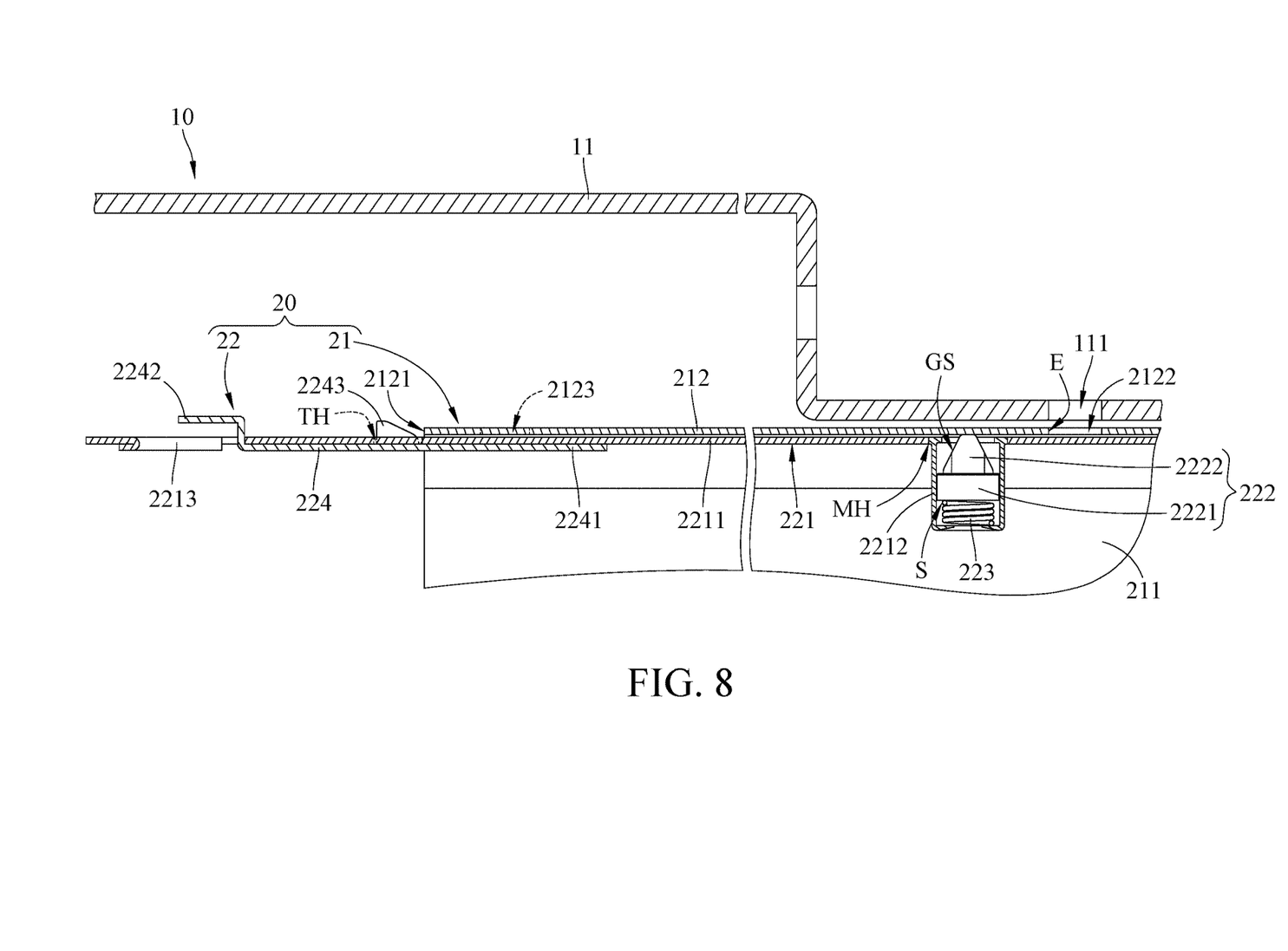

Then, referring to FIGS. 5 to 8, FIG. 6 is a partial cross-sectional view of the rack module 1 in FIG. 4 when the fastener 224 is operated, and FIGS. 7 and 8 are partial cross-sectional views of the rack module 1 in FIG. 6 when the slidable component 221 is operated.

In a case of FIG. 5 that the engagement portion 2222 of the plunger 222 is engaged with the engagement hole 111 of the side part 11 of the rack 10, the support assembly 20 is fixed to the rack 10. Then, as shown in FIG. 6, when a maintainer desires to the remove the support assembly 20 from the rack 10 for maintaining the electronic device supported thereon, the first step is to operate the fastener 224 to detach the engagement blocks 2243 of the fastener 224 from the fastening holes 2123 of the side plate 212, such that the slidable component 221 is disengaged from the side plate 212. Then, as shown in FIGS. 7 and 8, the maintainer can hold the handle 2213 of the slidable component 221 and pull the slidable component 221 along a direction away from the front side 2121 of the side plate 212. During the movement of the slidable component 221, the plunger 222 is moved along with the slidable component 221, such that the guiding ramp GS of the engagement portion 2222 of the plunger 222 abuts an edge E of the hole 2122 of the side plate 212, such that the engagement portion 2222 of the plunger 222 is detached from the engagement hole 111 of the side part 11 of the rack 10 and retracts into the support casing 21 from the hole 2122 of the side plate 212 of the support casing 21. Therefore, the maintainer can remove the entire support assembly 20 and the electronic device supported thereon from the rack 10 for maintenance.

In this embodiment, the slidable component 221 is slidably disposed on the support casing 21, the plunger 222 is slidably disposed in the slide channel S of the slidable component 221 and is inserted into the hole 2122 of the support casing 21 for being engaged with the rack 10, and the plunger 222 has a guiding ramp GS. Therefore, during the removal of the support assembly 20 from the rack 10, the maintainer can pull the slidable component 221 so as to force the guiding ramp GS of the plunger 222 to resist against the edge E of the hole 2122 when the plunger 222 is disengaging from the rack 10. As a result, the support assembly 20 and the electronic device supported thereon can be easily and quickly removed from the rack 10 via a toolless manner.

On the contrary, when the maintainer finishes the maintenance and desires to reinstall the support assembly 20 and the electronic device supported thereon into the rack 10, the maintainer can place the support assembly 20 and the electronic device supported thereon into the rack 10 when the engagement portion 2222 of the plunger 222 is retained to be retracted into the support casing 21. Then, the maintainer can hold the handle 2213 of the slidable component 221 to push the slidable component 221 along a direction towards the front side 2121 of the side plate 212, such that the spring 223 forces the engagement portion 2222 of the plunger 222 to extend beyond the hole 2122 of the side plate 212 of the support casing 21 and insert into the engagement hole 111 of the side part 11 of the rack 10, and the engagement blocks 2243 of the fastener 224 are engaged with the fastening holes 2123 of the side plate 212 of the support casing 21. As a result, the support assembly 20 and the electronic device supported thereon can be easily and quickly installed into the rack 10 via a toolless manner.

In this embodiment, the engagement blocks 2243 of the fastener 224 are respectively inserted into the through holes TH of the main bar 2211 of the slidable component 221 and are respectively engaged with to the fastening holes 2123 of the side plate 212 of the support casing 21, such that the slidable component 221 is fixed to the side plate 212 for preventing the slidable component 221 from any unwanted movement.

It should be noted that the quantities of the engagement blocks 2243 of the fastener 224, the through holes TH of the main bar 2211 of the slidable component 221, and the fastening holes 2123 of the side plate 212 of the support casing 21 are not restricted in the disclosure and may be modified according to actual requirements. In addition, the fastener 224 is an optional component. In some other embodiments, the release mechanism may not include the fastener, and the slidable component may be fixed by other suitable structures or components.

On the other hand, the handle 2213 of the slidable component 221 extends beyond the front side 2121 of the side plate 212 of the support casing 21, which facilitates the maintainer to hold and move the slidable component 221. It should be noted that the handle 2213 of the slidable component 221 is not restricted to extending beyond the front side 2121 of the side plate 212 of the support casing 21. In some other embodiments, the handle of the slidable component may be even with the front side of the side plate of the support casing or may be located inwards the front side of the side plate of the support casing.

In this embodiment, the quantity of the release mechanisms 22 is two, and the release mechanisms 22 are respectively disposed on the side plates 212 of the support casing 21 located opposite to each other, but the disclosure is not limited thereto. In some other embodiments, the support assembly may include only one release mechanism, and this release mechanism may be disposed on one of the side plates of the support casing. Moreover, in one release mechanism 22, the quantities of the plungers 222, the springs 223 and the barrels 2212 of the slidable component 221 are not restricted to being multiple and may be modified to be one in some other embodiments. In such a case, the quantity of the hole of the support casing may be one, correspondingly.

Figure 9:
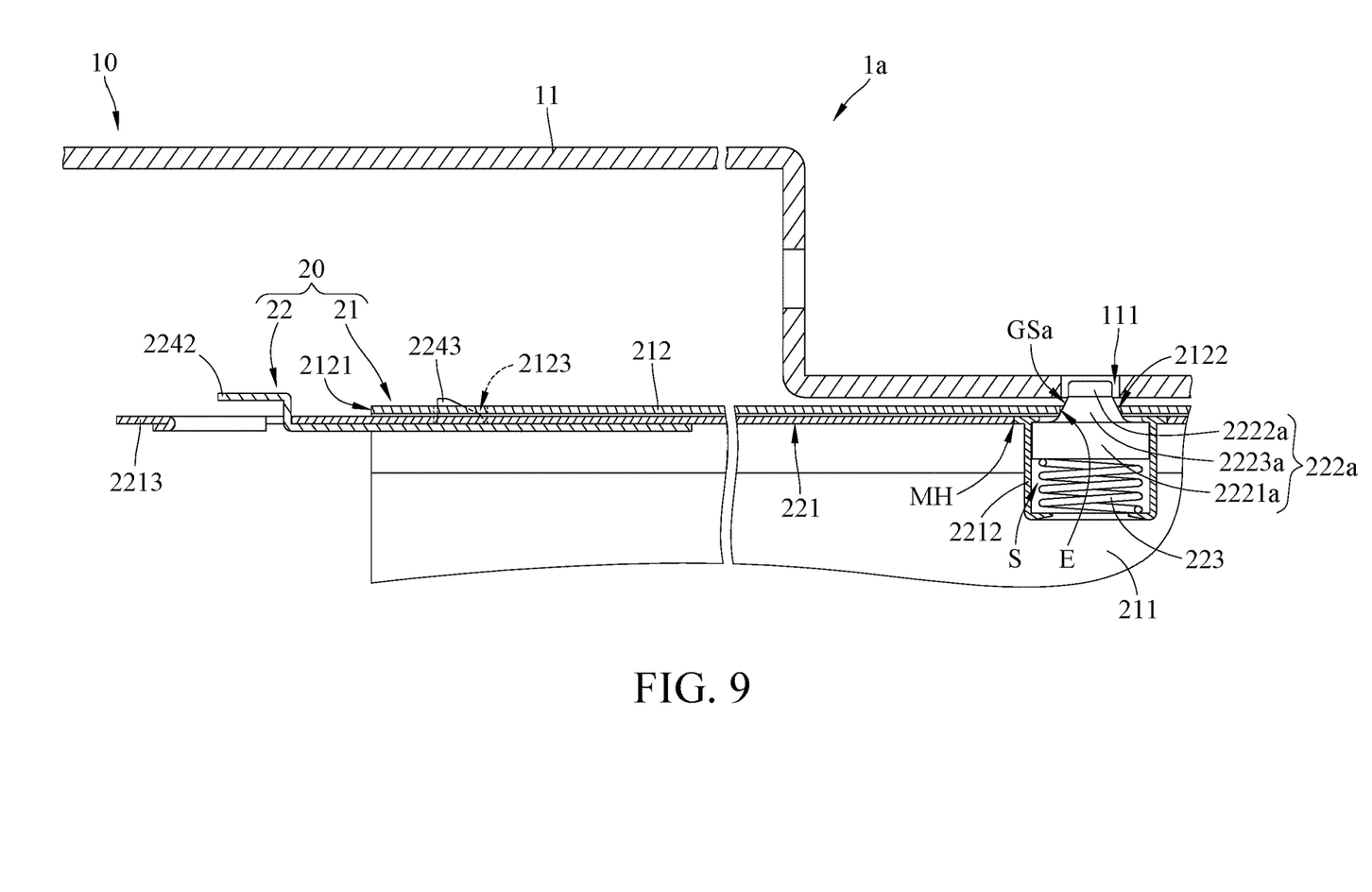
FIG. 9 is a partial cross-sectional view of a rack module according to a second embodiment of the disclosure.

Referring to FIG. 9, FIG. 9 is a partial cross-sectional view of a rack module 1a according to a second embodiment of the disclosure.

The rack module 1a of this embodiment is similar to the rack module 1 of the previous embodiment, and the plungers of the release mechanisms thereof are structurally distinct. Therefore, the following paragraphs will mainly introduce such difference, and details of the same parts between the rack modules 1 and 1a can be referred to the previous paragraphs and thus will not be repeatedly introduced hereinafter.

In this embodiment, a plunger 222a of the release mechanism 22 includes a guide portion 2221a, a cushion 2223a and an engagement portion 2222a. The cushion 2223a is located between and connected to the guide portion 2221a and the engagement portion 2222a. The guide portion 2221a is slidably disposed in the slide channel S of the barrel 2212 of the slidable component 221. The cushion 2223a has a guiding ramp GSa. The engagement portion 2222a is inserted into the hole 2122 of the side plate 212 of the support casing 21 and is engaged with the engagement hole 111 of the side part 11 of the rack 10.

Figure 10:
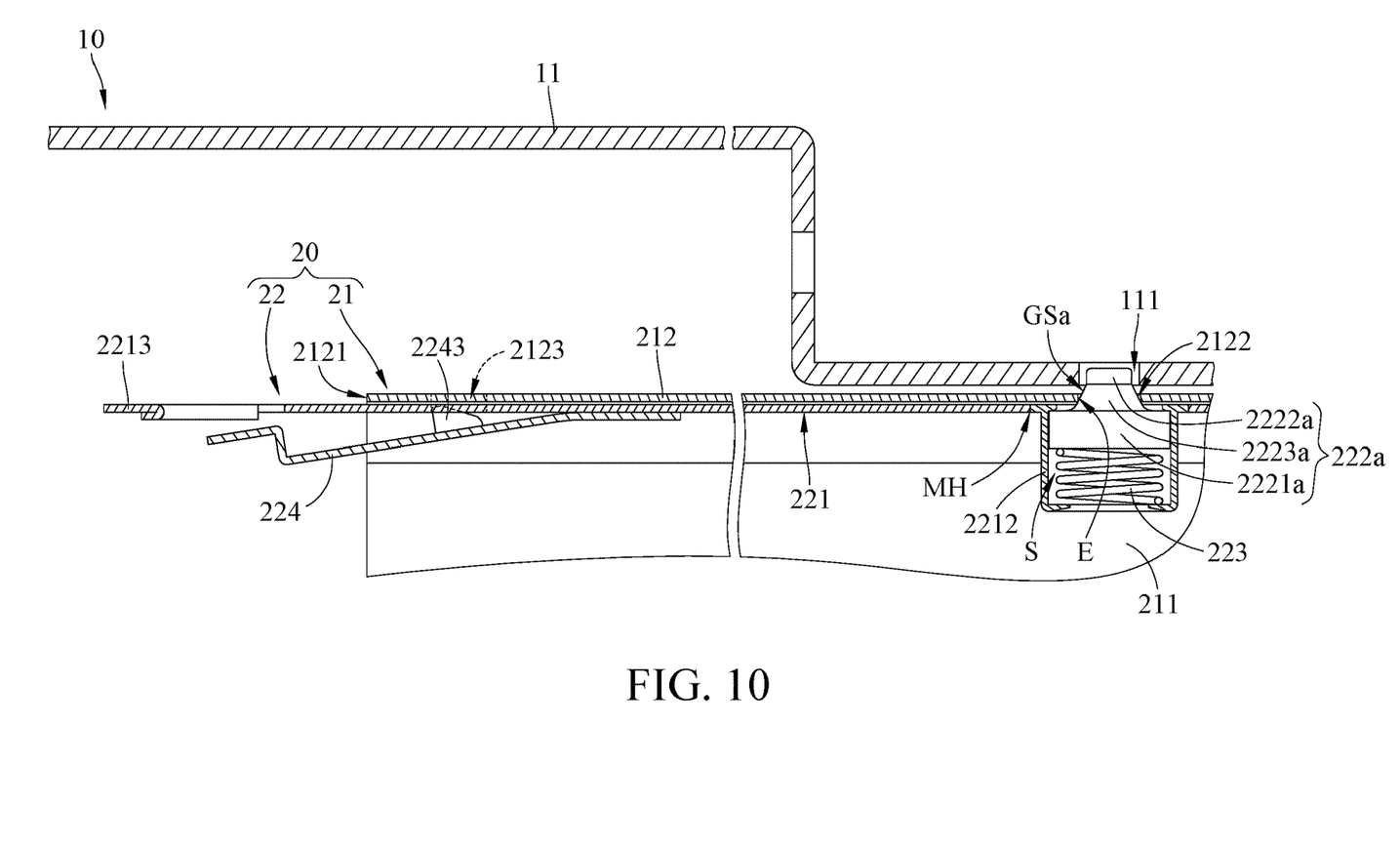
FIG. 10 is a partial cross-sectional view of the rack module in FIG. 9 when a fastener is operated.
Figure 11:
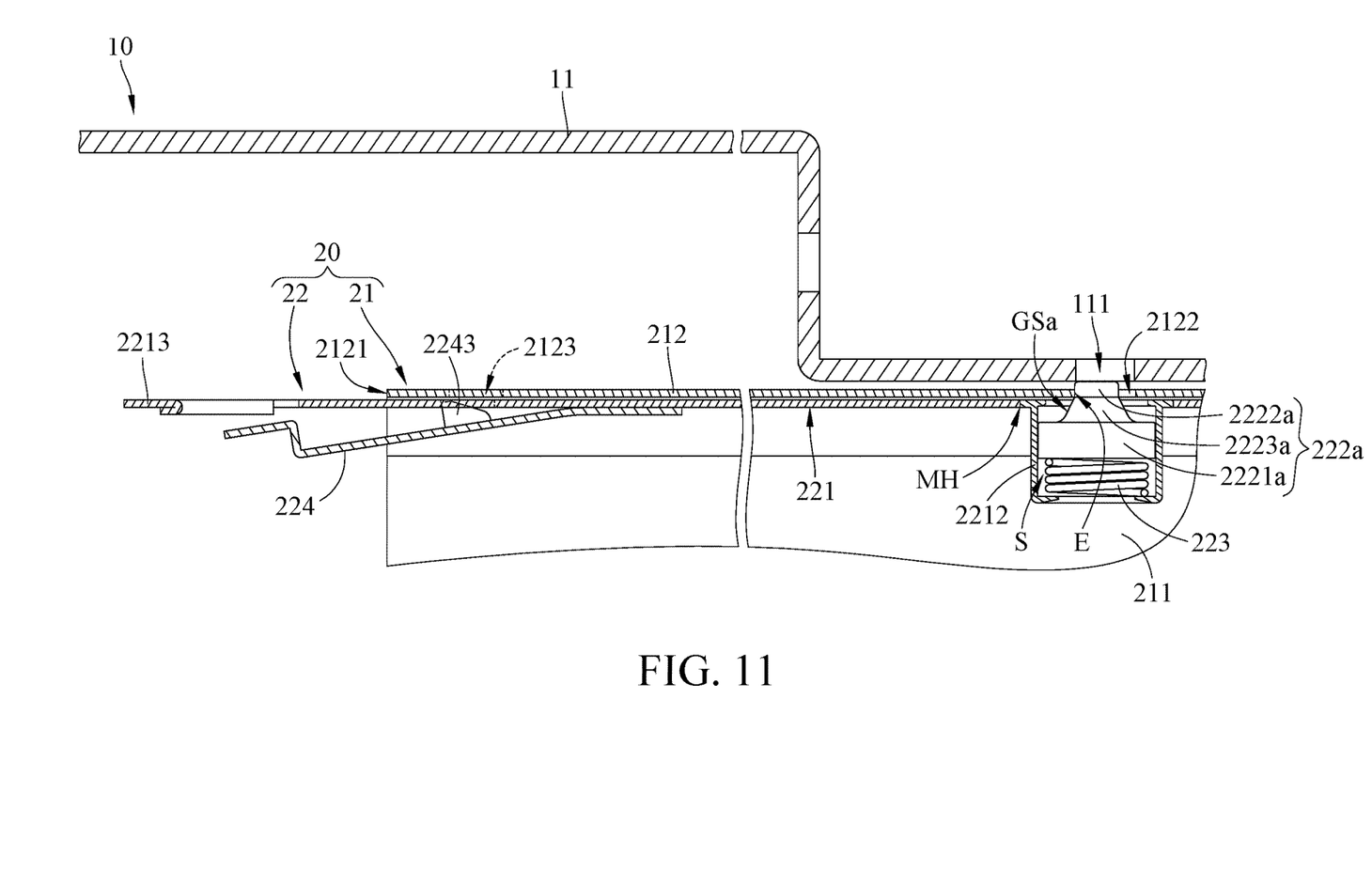
FIG. 11 is a partial cross-sectional view of the rack module in FIG. 10 when a slidable component is operated.

Then, referring to FIGS. 10 and 11, FIG. 10 is a partial cross-sectional view of the rack module 1a in FIG. 9 when the fastener 224 is operated, and FIG. 11 is a partial cross-sectional view of the rack module 1a in FIG. 10 when the slidable component 221 is operated.

As shown in FIG. 10, when the maintainer desires to the remove the support assembly 20 from the rack 10 for maintaining the electronic device supported thereon, the first step is to operate the fastener 224 to detach the engagement blocks 2243 of the fastener 224 from the fastening holes 2123 of the side plate 212, such that the slidable component 221 is disengaged from the side plate 212. Then, as shown in FIG. 11, the maintainer can hold the handle 2213 of the slidable component 221 and pull the slidable component 221 along a direction away from the front side 2121 of the side plate 212. During the movement of the slidable component 221, the plunger 222a is moved along with the slidable component 221, such that the guiding ramp GSa of the cushion 2223a of the plunger 222a abuts the edge E of the hole 2122 of the side plate 212, such that the engagement portion 2222a of the plunger 222a is detached from the engagement hole 111 of the side part 11 of the rack 10 and contacts the edge E of the hole 2122 of the side plate 212. Then, the maintainer can keep pulling the slidable component 221 so as to move the support casing 21 out from the rack 10 via the engagement portion 2222a of the plunger 222a for performing maintenance to the electronic device (not shown) on the support casing 21.

On the contrary, when the maintainer finishes the maintenance and desires to reinstall the support assembly 20 and the electronic device supported thereon into the rack 10, the maintainer can place the support assembly 20 and the electronic device supported thereon into the rack 10 when the engagement portion 2222a of the plunger 222a is retained to contact the edge E of the hole 2122 of the side plate 212 of the support casing 21. Then, the maintainer can hold the handle 2213 of the slidable component 221 to push the slidable component 221 along a direction towards the front side 2121 of the side plate 212, such that the spring 223 forces the engagement portion 2222a of the plunger 222a to insert into the engagement hole 111 of the side part 11 of the rack 10, and the engagement blocks 2243 of the fastener 224 are engaged with the fastening holes 2123 of the side plate 212 of the support casing 21. As a result, the installation of the support assembly 20 and the electronic device supported thereon into the rack 10 is finished.

According to the support assembly and the rack module as discussed in the above embodiments, the slidable component is slidably disposed on the support casing, the plunger is slidably disposed in the slide channel of the slidable component and is inserted into the hole of the support casing for being engaged with the rack, and the plunger has a guiding ramp. Therefore, during the removal of the support assembly from the rack, the maintainer can slide the slidable component so as to force the guiding ramp of the plunger to resist against the edge of the hole when the plunger is disengaging from the rack. As a result, the support assembly and the electronic device supported thereon can be easily and quickly removed from the rack via a toolless manner. Furthermore, the aforementioned configuration also enables the support assembly and the electronic device supported thereon to be easily and quickly installed into the rack via a toolless manner.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A support assembly configured to be mounted in a rack, comprising:
   a support casing formed with at least one hole; and
   at least one release mechanism comprising a slidable component and at least one plunger, wherein the slidable component is slidably disposed on the support casing, the slidable component has at least one slide channel, the at least one plunger is slidably disposed in the at least one slide channel of the slidable component and is inserted into the at least one hole for being engaged with the rack, the at least one plunger has a guiding ramp, and the guiding ramp is configured to resist against an edge of the at least one hole when the at least one plunger is disengaging from the rack;
   wherein the at least one plunger comprises a guide portion, a cushion and an engagement portion, the cushion is located between the guide portion and the engagement portion, the guide portion is slidably disposed in the at least one slide channel of the slidable component, the guiding ramp is located at the cushion, and the engagement portion is inserted into the at least one hole for being engaged with the rack.

2. The support assembly according to claim 1, wherein the at least one release mechanism further comprises at least one spring, the at least one spring is disposed in the at least one slide channel, and the at least one spring is configured to force the at least one plunger to be inserted into the at least one hole for being engaged with the rack.

3. The support assembly according to claim 1, wherein the at least one release mechanism further comprises a fastener, the slidable component is formed with at least one through hole, the support casing is formed with at least one fastening hole, the fastener is movably disposed on the slidable component, the fastener has at least one engagement block, and the at least one engagement block is inserted into the at least one through hole and is engaged with the at least one fastening hole.

4. The support assembly according to claim 3, wherein the fastener is a stamping sheet.

5. The support assembly according to claim 1, wherein the support casing comprises a bottom plate and two side plates, the two side plates respectively stand on two opposite sides of the bottom plate, the at least one hole comprises a plurality of holes, the plurality of holes are respectively located at the two side plates, the at least one release mechanism comprises two release mechanisms, and the two release mechanisms are respectively disposed on the two side plates.

6. The support assembly according to claim 5, wherein in each of the two release mechanisms, the at least one slide channel of the slidable component comprises a plurality of slide channels, the at least one plunger comprises a plurality of plungers, the plurality of plungers are respectively and slidably disposed in the plurality of slide channels of the slidable component and are respectively inserted into the plurality of holes for being engaged with the rack.

7. The support assembly according to claim 1, wherein the slidable component comprises a main bar and at least one barrel, the main bar is slidably disposed on the support casing, the main bar is formed with a mount hole, the at least one barrel is mounted in the mount hole of the main bar, and the at least one slide channel is located at the at least one barrel.

8. The support assembly according to claim 7, wherein the support casing has a front side, the slidable component further comprises a handle, the handle is connected to the main bar and extends beyond the front side of the support casing.

9. A rack module comprising:
   a rack formed with at least one engagement hole; and
   a support assembly comprising:
   a support casing formed with at least one hole; and
   at least one release mechanism comprising a slidable component and at least one plunger, wherein the slidable component is slidably disposed on the support casing, the slidable component has at least one slide channel, the at least one plunger is slidably disposed in the at least one slide channel of the slidable component, the at least one plunger is inserted into the at least one hole and is engaged with the at least one engagement hole of the rack, the at least one plunger has a guiding ramp, and the guiding ramp is configured to resist against an edge of the at least one hole when the at least one plunger is disengaging from the at least one engagement hole of the rack;
   wherein the at least one plunger comprises a guide portion, a cushion and an engagement portion, the cushion is located between the guide portion and the engagement portion, the guide portion is slidably disposed in the at least one slide channel of the slidable component, the guiding ramp is located at the cushion, and the engagement portion is inserted into the at least one hole and is engaged with the at least one engagement hole of the rack.

10. The rack module according to claim 9, wherein the at least one release mechanism further comprises at least one spring, the at least one spring is disposed in the at least one slide channel, and the at least one spring is configured to force the at least one plunger to be inserted into the at least one hole and engaged with the at least one engagement hole of the rack.

11. The rack module according to claim 9, wherein the at least one release mechanism further comprises a fastener, the slidable component is formed with at least one through hole, the support casing is formed with at least one fastening hole, the fastener is movably disposed on the slidable component, the fastener has at least one engagement block, and the at least one engagement block is inserted into the at least one through hole and is engaged with the at least one fastening hole.

12. The rack module according to claim 11, wherein the fastener is a stamping sheet.

13. The rack module according to claim 9, wherein the at least one engagement hole of the rack comprises a plurality of engagement holes, the plurality of engagement holes are located at two opposite sides of the rack, the support casing comprises a bottom plate and two side plates, the two side plates respectively stand on two opposite sides of the bottom plate, the at least one hole comprises a plurality of holes, the plurality of holes are respectively located at the two side plates, the at least one release mechanism comprises two release mechanisms, and the two release mechanisms are respectively disposed on the two side plates.

14. The rack module according to claim 13, wherein in each of the two release mechanisms, the at least one slide channel of the slidable component comprises a plurality of slide channels, the at least one plunger comprises a plurality of plungers, the plurality of plungers are respectively and slidably disposed in the plurality of slide channels of the slidable component, and the plurality of plungers are respectively inserted into the plurality of holes and engaged with the plurality of engagement holes of the rack.

15. The rack module according to claim 9, wherein the slidable component comprises a main bar and at least one barrel, the main bar is slidably disposed on the support casing, the main bar is formed with a mount hole, the at least one barrel is mounted in the mount hole of the main bar, and the at least one slide channel is located at the at least one barrel.

16. The rack module according to claim 15, wherein the support casing has a front side, the slidable component further comprises a handle, the handle is connected to the main bar and extends beyond the front side of the support casing.

* * * * *